United States Patent
Miyachi et al.

(10) Patent No.: US 8,022,494 B2
(45) Date of Patent: Sep. 20, 2011

(54) PHOTODETECTOR AND MANUFACTURING METHOD THEREOF

(75) Inventors: Yukiya Miyachi, Tokyo (JP); Wojciech P. Giziewicz, Cambridge, MA (US); Jurgen Michel, Cambridge, MA (US); Lionel C. Kimerling, Cambridge, MA (US)

(73) Assignees: FUJIFILM Corporation, Tokyo (JP); Massachusetts Institute of Technology, Cambridge, MA (US)

( * ) Notice: Subject to any disclaimer, the term of this patent is extended or adjusted under 35 U.S.C. 154(b) by 754 days.

(21) Appl. No.: 11/700,043

(22) Filed: Jan. 31, 2007

(65) Prior Publication Data

US 2008/0179700 A1    Jul. 31, 2008

(51) Int. Cl.
*H01L 31/075* (2006.01)
*H01L 31/07* (2006.01)

(52) U.S. Cl. ........ 257/458; 257/449; 257/453; 257/457; 257/461; 257/E31.057; 257/E31.061; 257/E31.065

(58) Field of Classification Search ............... 257/458, 257/E31.038, E31.061, 292, 449, 453, 457, 257/461, E31.057, E31.065; 438/67
See application file for complete search history.

(56) References Cited

U.S. PATENT DOCUMENTS

| | | | |
|---|---|---|---|
| 6,027,956 A * | 2/2000 | Irissou | 438/68 |
| 2004/0061152 A1* | 4/2004 | Kashiura et al. | 257/292 |
| 2004/0119093 A1* | 6/2004 | Cohen et al. | 257/200 |
| 2005/0184354 A1* | 8/2005 | Chu et al. | 257/458 |

FOREIGN PATENT DOCUMENTS

| | | |
|---|---|---|
| JP | 5-175536 A | 7/1993 |
| JP | 2004119713 A | 4/2004 |
| JP | 2004-200685 A | 7/2004 |
| WO | 2005083750 A2 | 9/2005 |

OTHER PUBLICATIONS

M. Yang, et al, "A High Speed, High-Sensitivity Silicon Lateral Trench Photodetector", IEEE Electron Device Letters, vol. 23, No. 7, pp. 395-397, 2002.
C.L. Schow et al, "Design and Implementation of High-Speed Planar Si Photodiodes Fabricated on SOI Substrates", IEEE Journal of Quantum Electronics, vol. 35, No. 10, pp. 1478-1482, 1999.
W.P. Giziewicz et al, "Large Diameter, CMOS-Manufacturable Photodetectors for over 2 Gbps Polymer Optical Fiber Applications", Proceedings of the Integrated Photonics Research and Applications, 2006.
Japanese Office Action corresponding to Japanese Patent Application No. 2007-083431 dated Oct. 12, 2010.

* cited by examiner

*Primary Examiner* — Ngan Ngo
*Assistant Examiner* — Benjamin Tzu-Hung Liu
(74) *Attorney, Agent, or Firm* — Sughrue Mion, PLLC

(57) ABSTRACT

A lateral photodiode, with improved response speed, includes a semiconductor substrate having active regions, and a p-type region and an n-type region arranged parallel to the surface of the substrate. The active regions are an n-layer and a p-layer respectively, and stacked in the thickness direction of the substrate to form a p-n junction. In addition, a barrier layer, for preventing movement of carriers from the substrate toward the active region, is provided on the side of the active regions toward the substrate.

19 Claims, 13 Drawing Sheets

(A) ◆ p bulk
(B) ▲ Buried junction
(C) ● SOI
(D) ✕ Buried junction on SOI

—— 50μm diameter
—·— 100μm diameter
------ 200μm diameter

Bulk structure

Buried junction structure

Buried junction on SOI structure

Buried junction on SOI structure

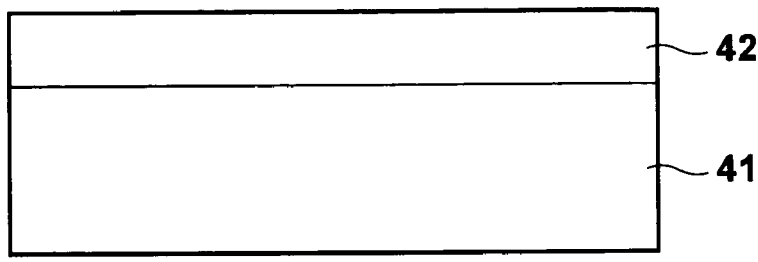
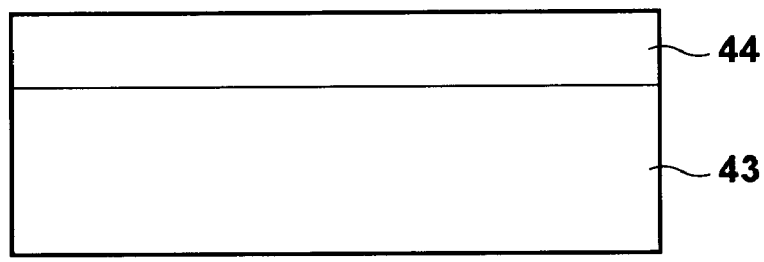
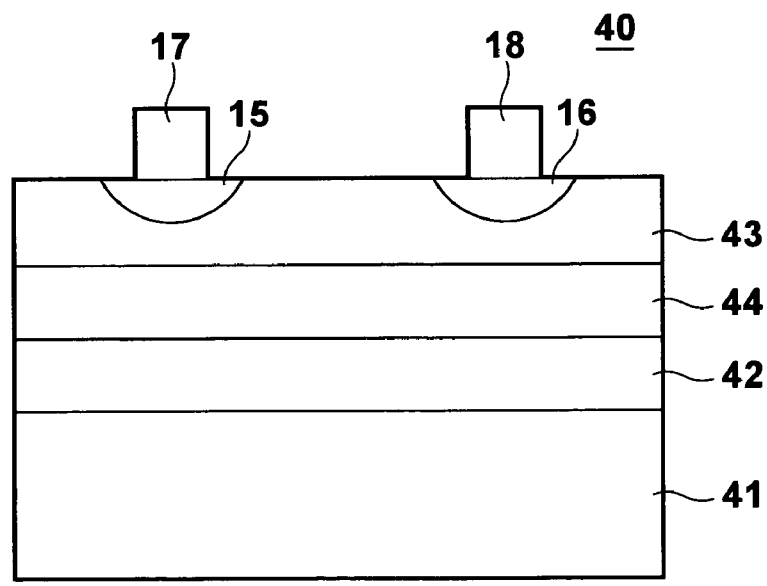

PHOTODETECTOR AND MANUFACTURING METHOD THEREOF

BACKGROUND OF THE INVENTION

1. Field of the Invention

The present invention relates to a lateral photodetector, and a method for manufacturing the same.

2. Description of the Related Art

Lateral photodiodes, in which p-type and n-type regions are arranged parallel to the surface of the substrate, are known as described for example in Japanese Unexamined Patent Publication No. 5(1993)-175536. FIG. 8 illustrates a basic structure of a lateral photodiode. As illustrated, a semiconductor layer 2 is formed on a substrate 1, and a p-type region 3 and an n-type region 4 are formed parallel to the surface of the substrate 1 within the semiconductor layer 2. Electrodes 8 and 9 are connected to the p-type region 3 and n-type region 4 respectively, and an insulation layer 7 is formed to cover the semiconductor layer 2 from above. In a lateral photodiode having such structure, absorption of light and movement of carriers occur in an area of the semiconductor layer near the surface, so that it may realize a high speed operation compared to a well known vertical photodiode, in which p-type and n-type regions are stacked in the thickness direction of the substrate.

The demand for even higher speed for such lateral photodiodes, however, is growing. That is, in conventional lateral photodiodes, Si (silicon) forming p-type and n-type regions has low absorption rate for light with wavelengths in the long wavelength range of 650 nm and above, which is often the detection target range in general purpose applications, so that a considerable time is required for movement of carriers, which is one of the impediments to a high speed response.

As structures for realizing a high speed response in lateral photodetectors, the following are known. That is, a lateral photodetector having a deep trench structure, in which comb electrodes connected to the p-type and n-type regions are formed, is known as described, for example, in non-patent literature "A high-speed, high-sensitivity silicon lateral trench photodetector", by M. Yang et al., IEEE Electron Device Letters, vol. 23, Issue 7, pp. 395-397, 2002 (non-patent document 1). Further, another type of lateral photodetector in which a high speed response is realized by isolating the active layer from the substrate using an electrical or a physical barrier layer is also known as described, for example, in non-patent literature "Design and implementation of high-speed planar Si photodiodes fabricated on SOI substrates" by C. Schow et al., IEEE Journal of Quantum Electronics, vol. 35, Issue 10, pp. 1478-1482, 1999 (non-patent reference document 2) and Japanese Unexamined Patent Publication No. 2004-200685.

In the mean time, a lateral photodetector that includes an active layer having a p-layer and an n-layer stacked in the thickness direction of the substrate to form a p-n junction is described in non-patent literature "Large Diameter, CMOS-Manufacturable Photodetectors for over 2 Gbps Polymer Optical Fiber Applications", by W. P. Giziewicz et al., Proceedings "Integrated Photonics Research and Applications", 2006 (non-patent document 3). In the structure, the areas of the active region, to which electrodes are connected, are separated from the carriers of the substrate by means of the p-n junction.

Further, a lateral MSM (Metal-Semiconductor-Metal) photodetector, which includes a substrate having thereon an active region, and a cathode and an anode arranged parallel to the surface of the substrate, each forming a Schottky metal contact with the active region, is also known as described, for example, in U.S. Patent Application Publication No. 20040119093. In this type of lateral photodetectors, even higher response speed is demanded.

The structure described in the non-patent document 1, however, requires an additional manufacturing process for providing the deep trench structure, which makes the photodetector costly to manufacture. The structure described in the non-patent document 2 requires a high resistance material for the active layer, which makes the photodetector difficult to fabricate. If a high resistance material is not used in the active layer, the whole area of the active layer does not become a depletion layer, so that the carriers need to move by diffusion and a sufficient speed is not obtained.

In the mean time, it is known that a frequency response is extremely slow for strong input light, and high speed response is not obtained in the structure described in the non-patent document 3.

SUMMARY OF THE INVENTION

The present invention has been developed in view of the circumstances described above, and it is an object of the present invention to provide a photodetector having sufficient high speed response, and is yet easy to manufacture.

A photodetector of the present invention is a lateral photodetector, including a semiconductor substrate having thereon an active region, with a p-type region and an n-type region arranged parallel to the surface of the substrate, wherein:

the active region is formed by a p-layer and an n-layer which are stacked in the thickness direction of the substrate and constitute a p-n junction; and a barrier layer, for preventing movement of carriers from the substrate toward the active region, is formed on the side of the active region toward the substrate.

Preferably, the barrier layer described above includes $SiO_2$.

Further, it is preferable that the photodetector of the present invention comprises an SOI (Silicon on Insulator) substrate that includes a handling substrate on which an insulation layer and a silicon layer are formed in this order; and the handling substrate of the SOI substrate constitutes the semiconductor substrate, the insulation layer on the handling substrate constitutes the barrier layer, and the silicon layer on the insulation layer constitutes at least either the p-layer or the n-layer disposed closer to the barrier layer.

Still further, the following structure may be employed in the photodetector of the present invention: the n-layer is disposed closer to the barrier layer than the p-layer, and the thickness of the n-layer in the portion under the n-type region is greater than in the portion under the p-type region. Alternatively, the following structure may also be employed in the photodetector of the present invention: the p-layer is disposed closer to the barrier layer than the n-layer, and the thickness of the p-layer in the portion under the p-type region is greater than in the portion under the n-type region.

Further, preferably in the photodetector of the present invention, a PIN photodetector structure is formed by the active region, p-type region, and n-type region.

Another photodetector of the present invention is a lateral MSM (Metal-Semiconductor-Metal) photodetector, including a semiconductor substrate having thereon an active region, and a cathode and an anode arranged parallel to the surface of the substrate, each forming a Schottky metal contact with the active region, wherein:

the active region is formed by a p-layer and an n-layer which are stacked in the thickness direction of the substrate and constitute a p-n junction; and a barrier layer, for preventing movement of carriers from the substrate toward the active region, is formed on the side of the active region toward the substrate.

Preferably, also in the another photodetector of the present invention, the barrier includes $SiO_2$.

Further, it is preferable that the another photodetector of the present invention also comprises an SOI (Silicon on Insulator) substrate that includes a handling substrate on which an insulation layer and a silicon layer are formed in this order; and the handling substrate of the SOI substrate constitutes the semiconductor substrate, the insulation layer on the handling substrate constitutes the barrier layer, and the silicon layer on the insulation layer constitutes at least either the p-layer or the n-layer disposed closer to the barrier layer.

Still further, the following structure may be employed in the another photodetector of the present invention: the n-layer is disposed closer to the barrier layer than the p-layer, and the thickness of the n-layer in the portion under the anode is greater than in the portion under the cathode. Alternatively, the following structure may also be employed in the another photodetector of the present invention: the p-layer is disposed closer to the barrier layer than the n-layer, and the thickness of the p-layer in the portion under the cathode is greater than in the portion under the anode.

A method for manufacturing a photodetector of the present invention is a method for manufacturing the photodetector of the present invention described above, the method including the steps of:

forming the barrier layer on a single substrate;

forming the p-n junction by injecting a dopant into another substrate;

bonding the another substrate on the single substrate; and grinding the another substrate to reduce the thickness thereof and forming components that constitute a photodetector on the reduced substrate.

Another method for manufacturing a photodetector of the present invention is a method for manufacturing the photodetector of the present invention described above, the method including the steps of:

forming the p-n junction by injecting a dopant into an SOI (Silicon on Insulator) substrate; and forming a photodetector on the substrate.

Still another method for manufacturing a photodetector of the present invention is a method for manufacturing the photodetector of the present invention described above, the method including the steps of:

growing an epitaxial layer on an SOI (Silicon on Insulator) substrate so as to have an opposite conductivity type to that of the substrate; and forming a photodetector on the epitaxial layer.

In the manufacturing method described above, for example, a method for growing a Ge epitaxial layer, which constitutes the p-layer, on the silicon layer of the SOI substrate, which constitutes the n-layer, may be preferably used.

The first photodetector of the present invention described above may respond in extremely high speed for the following two reasons. Firstly, it has a p-n junction, and the electric field developed between the n-type region and p-type region, in the lateral direction (parallel or substantially parallel to the substrate) is met with the built-in potential of the p-n junction, thereby a depletion layer is extended remarkably and the lateral electric field is strongly enhanced. Secondly, it includes a barrier layer, which blocks a relatively slow movement of carriers from the substrate, so that a high speed lateral movement of carriers becomes predominant. The advantageous effects described above may also be obtained by the second photodetector of the present invention, which is a lateral MSM (Metal-Semiconductor-Metal) photodetector.

In the photodetectors of the present invention having the aforementioned structures, the active region is not necessarily formed of a high resistance material, unlike the structure described in the non-patent document 2. That is, doping density in the active region is allowed to be, for example, approximately $1 \times 10^{16}$ $cm^{-3}$, thereby the photodetectors may be fabricated easily. In this case, if the p-n junction described above is not formed, the frequency range would be limited to below several hundreds MHz. The photodetectors of the present invention have the p-n junction, so that such limitation in the frequency range may be prevented.

BRIEF DESCRIPTION OF THE DRAWINGS

FIGS. 13A to 13C schematically illustrate a manufacturing method and the structure of the photodiode according to a fourth embodiment of the present invention.

DESCRIPTION OF THE PREFERRED EMBODIMENTS

Hereinafter, exemplary embodiments of the present invention will be described in detail with reference to accompanying drawings.

First Embodiment

Figure 1:
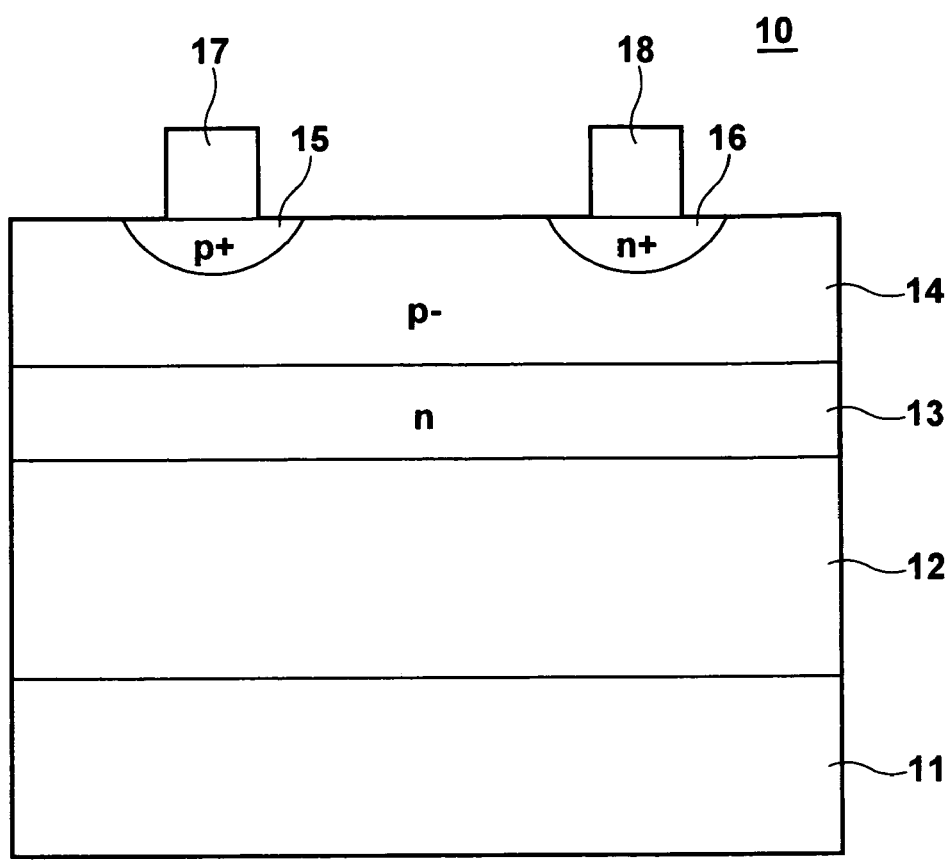
FIG. 1 is a schematic side view of the photodiode according to a first embodiment of the present invention.

FIG. 1 schematically illustrates the side shape of the lateral photodetector according to a first embodiment of the present invention. In the present embodiment, the photodetector is, by way of example, a photodiode. As illustrated, the photodiode 10 includes a substrate 11 on which a barrier layer 12, n-type active region (absorption region) 13, and a p-type active region 14 are stacked in this order. Further, a $p^+$ region 15 and an $n^+$ region 16, each having a finger-like shape, are arranged parallel to the surface of the substrate 11 near the surface of the p-type active region 14. A cathode 17 and an anode 18 are connected to the $p^+$ region 15 and $n^+$ region 16 respectively.

When light is irradiated on the photodiode 10, which has the aforementioned structure, from above in the drawing, carriers (holes and electrons) move between the $p^+$ region 15 and $n^+$ region 16, and a current flows through a load, if it is connected between the cathode 17 and anode 18, so that the light may be detected by detecting the current.

The photodiode 10 of the present invention may respond in an extremely high speed for the following two reasons. Firstly, the photodiode 10 includes a p-n junction formed by the n-type active region 13 and p-type active region 14, and the electric field developed between the $p^+$ region 15 and $n^+$ region 16 in the lateral direction, i.e., in the direction parallel or substantially parallel to the substrate 11 is met with the built-in potential of the p-n junction, thereby a depletion layer is extended remarkably and the lateral electric field is strongly enhanced. Secondly, it includes the barrier layer 12, which blocks a relatively slow movement of carriers from the substrate 11, so that a high speed lateral movement of carriers becomes predominant. If the relatively slow movement of carriers occurs, delayed current flows through the load connected between the cathode 17 and anode 18, thereby high speed response is hampered.

The photodiode 10 in the present embodiment is formed using, by way of example, an SOI (Silicon on Insulator) substrate. More specifically, an n-type SOI substrate which includes the handling substrate 11 on which a $SiO_2$ insulation layer and an n-type single-crystal silicon layer are formed in this order is provided, and the p-type active region 14 is formed by injecting a p-type dopant into a region of the n-type single-crystal silicon layer from the surface thereof to a predetermined depth. Here, the region of the SOI substrate without the p-type dopant is used as the n-type active region 13, and the $SiO_2$ insulation layer is used as the barrier layer 12. Thereafter, the manufacture of the photodiode 10 is completed after forming the $p^+$ region 15, $n^+$ region 16, cathode 17, and anode 18 through the commonly used process in the manufacture of a general lateral photodiode.

Computer simulation results for the response characteristics of the photodiode 10 will now be described. In the simulation, the following assumptions are made: the doping density is $5 \times 10^{15}$ $cm^{-3}$ for the n-type active region, $1 \times 10^{16}$ $cm^{-3}$ for the p-type active region, and 16 $1 \times 10^{19}$ $cm^{-3}$ for the $p^+$ region 15 and $n^+$ region; the width of the cathode 17 and anode 18 is 1 μm; the distance between the electrodes is 2 μm; the attached electrode resistance is 50Ω; and the reverse bias voltage rage is from 0 to 5V.

Figure 2:
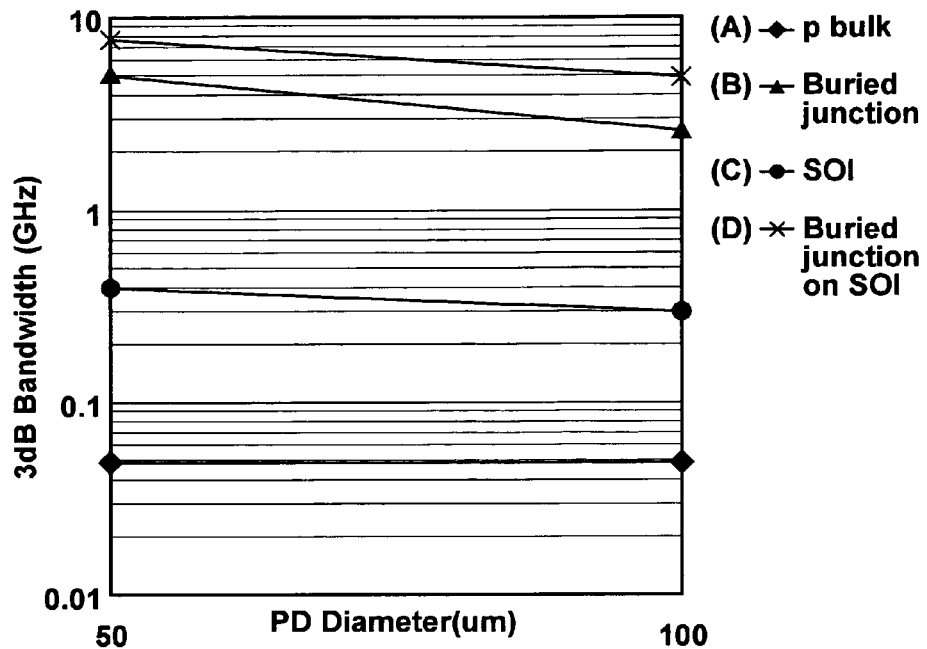
FIG. 2 is a graph that compares simulation results of the response characteristics of the photodiode shown in FIG. 1 with conventional photodiodes.

FIG. 2 compares the simulation results for cutoff frequencies (3 dB bandwidth) of the following photodiodes, including conventional devices, when the diameter of the light receiving section of each device is assumed to be 50 and 100 μm:

(A) Use of a p-type bulk substrate, without a p-n junction and a barrier layer (denoted as "p bulk" in the drawing)
(B) Only a p-n junction is provided (denoted as "Buried junction" in the drawing)
(C) Use of an SOI substrate, with only a barrier layer (denoted as "SOI" in the drawing)
(D) Present invention (denoted as "Buried junction on SOI" in the drawing).

Note that the reverse voltage is 3V here. As illustrated in the drawing, the photodiode 10 of the present embodiment has remarkably high speed response characteristics compared to the case where only the p-n junction or barrier layer is provided, not to mention to the case without the p-n junction and barrier layer.

Figure 3:
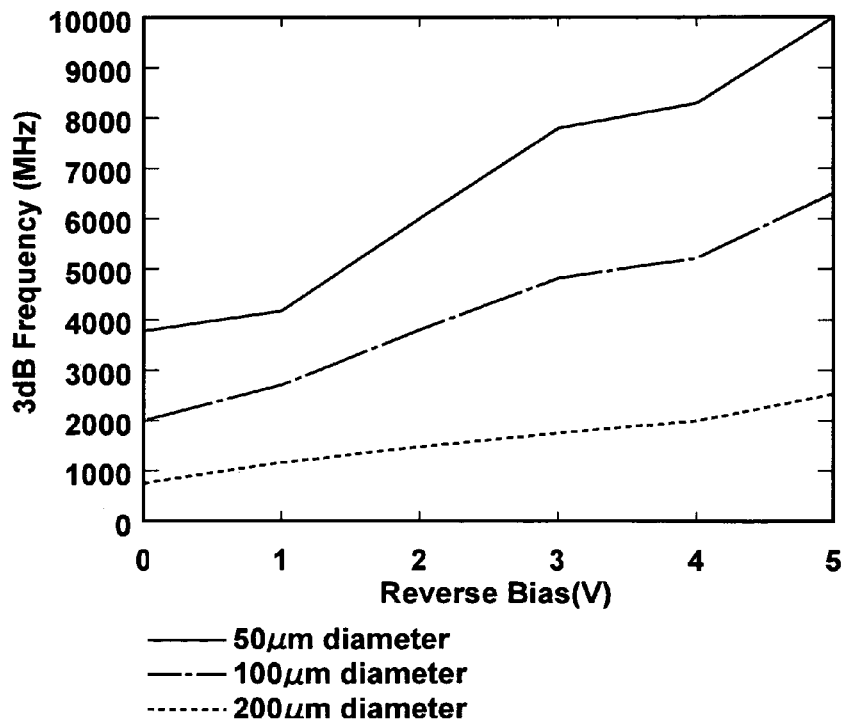
FIG. 3 is a graph illustrating simulation results of the response characteristics of the photodiode shown in FIG. 1 obtained under different conditions.
Figure 4:
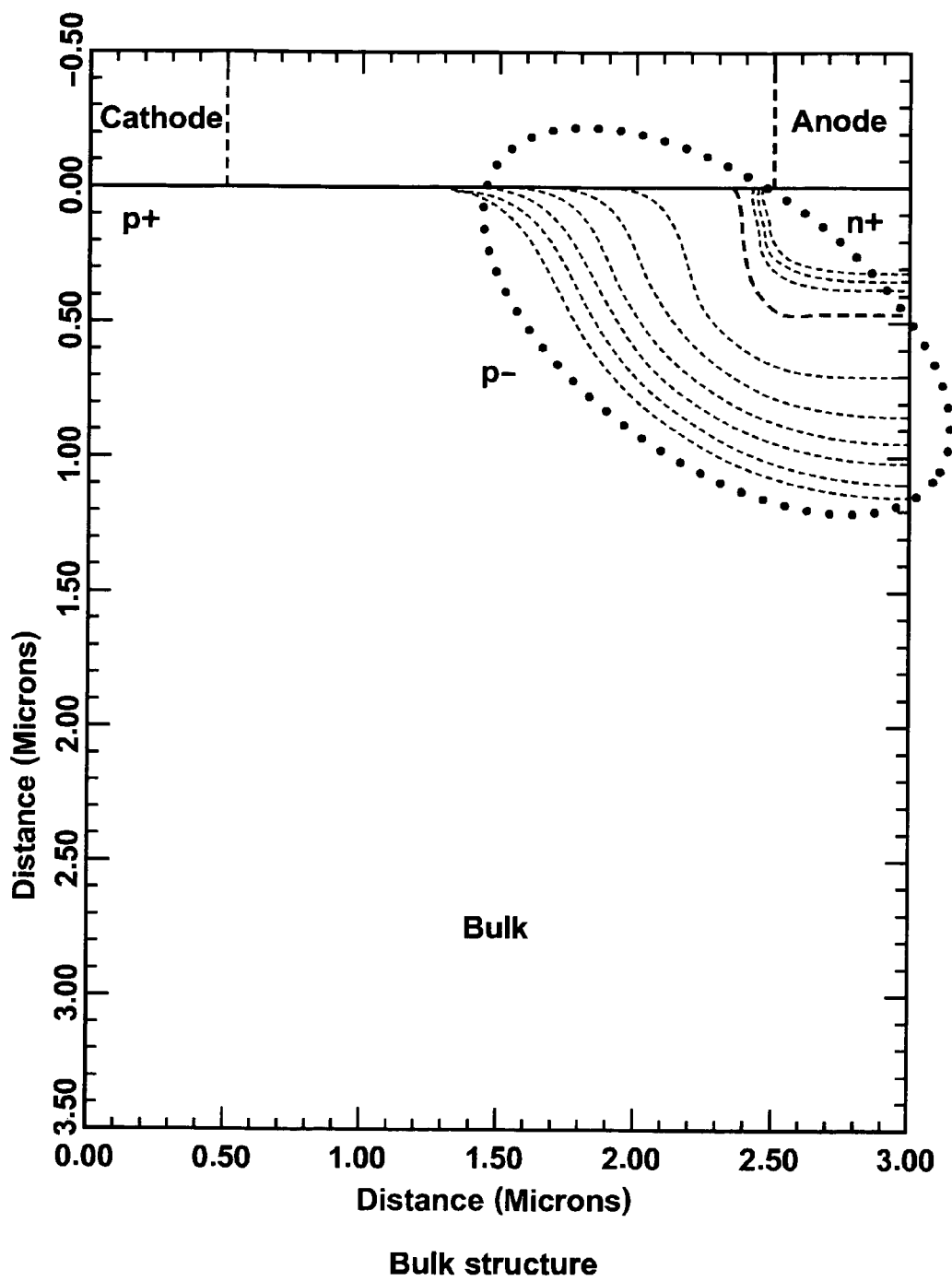
FIG. 4 illustrates simulation results for the extension of the depletion layer of a conventional photodiode.
Figure 5:
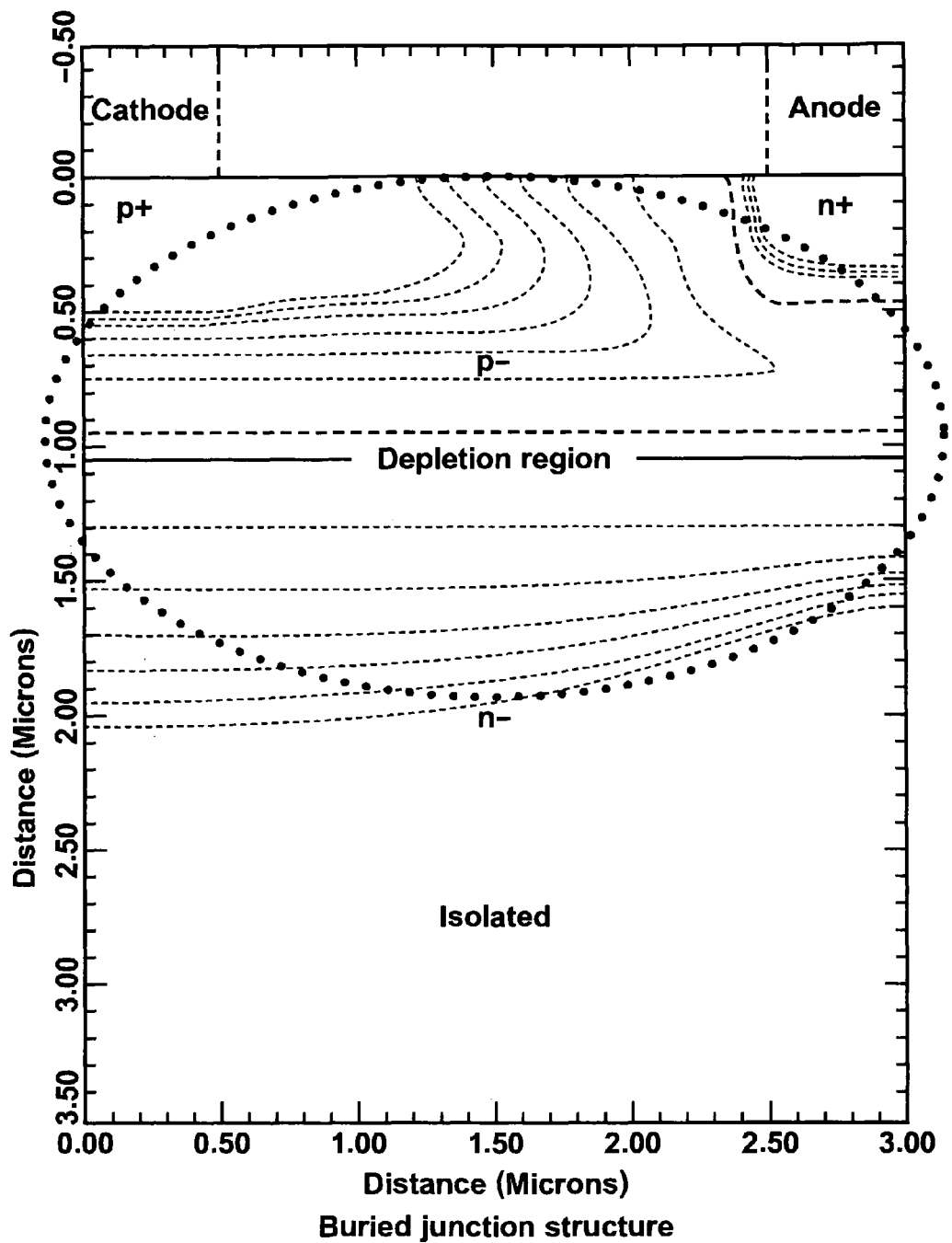
FIG. 5 illustrates simulation results for the extension of the depletion layer of another conventional photodiode.
Figure 6:
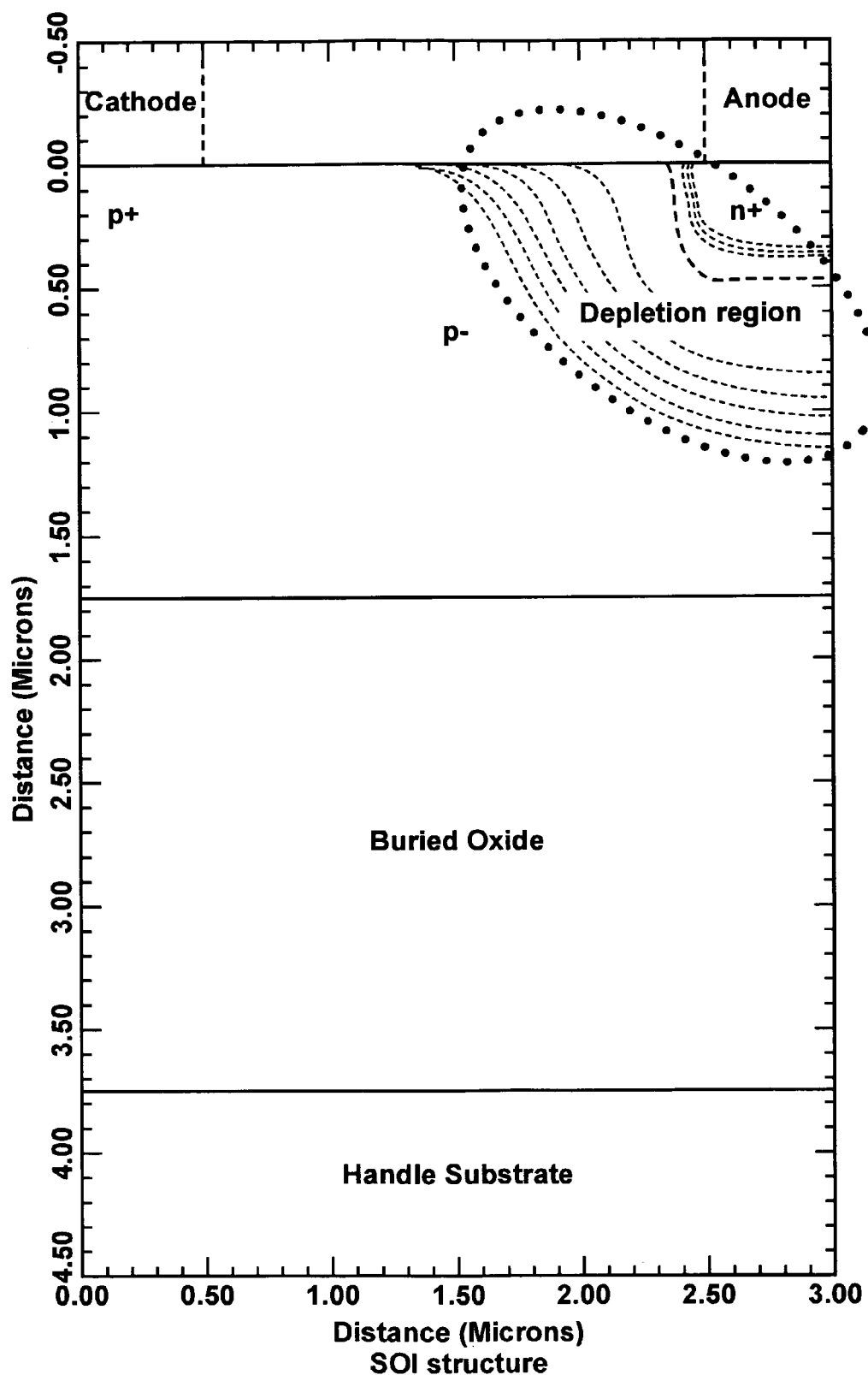
FIG. 6 illustrates simulation results for the extension of the depletion layer of still another conventional photodiode.
Figure 7:
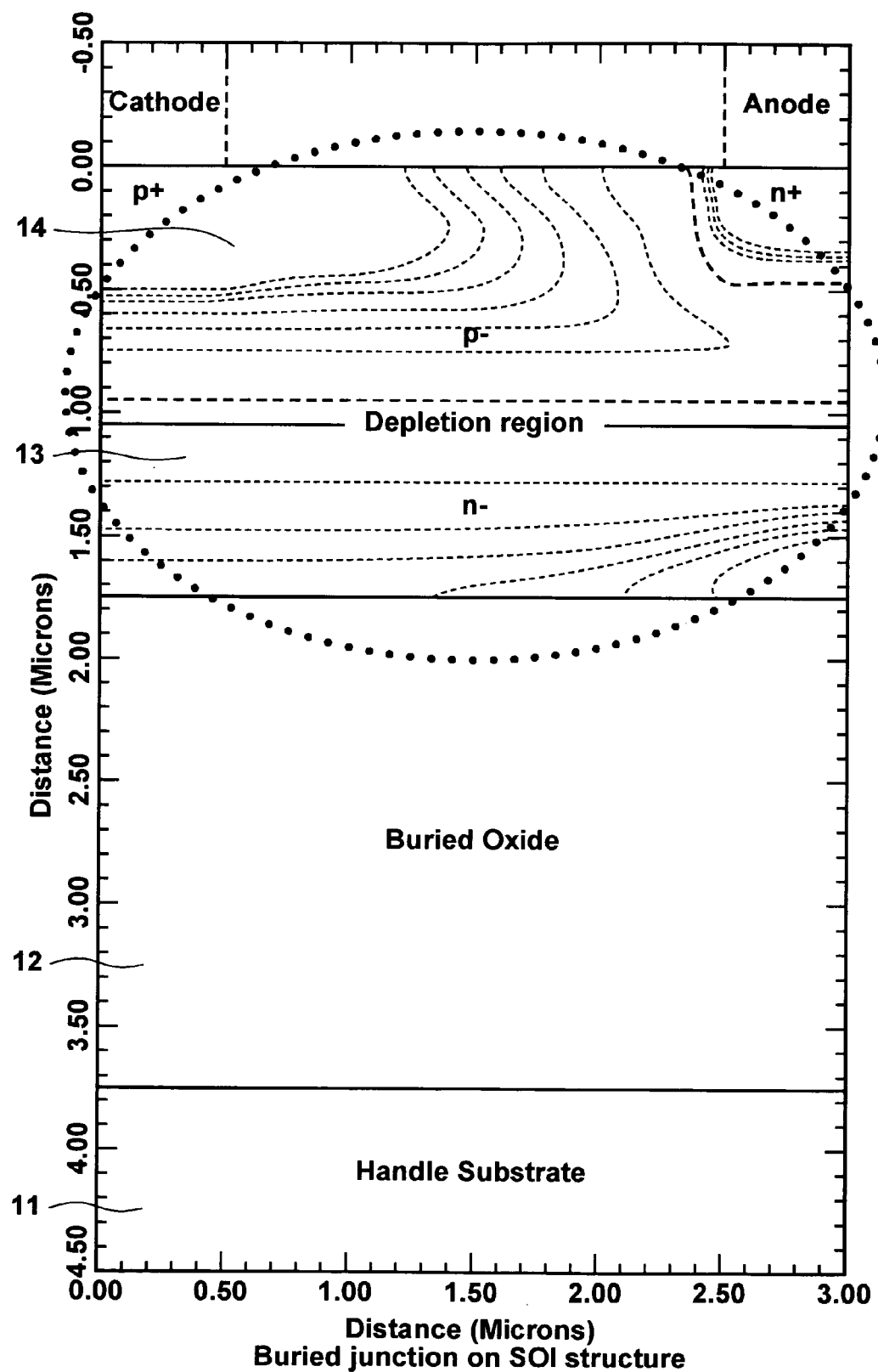
FIG. 7 illustrates simulation results for the extension of the depletion layer of the photodiode shown in FIG. 1.
Figure 8:
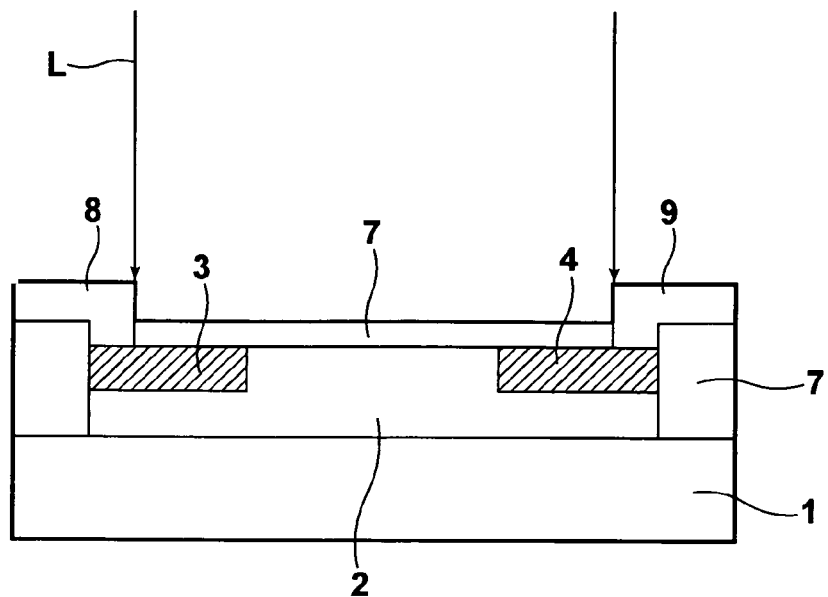
FIG. 8 is a schematic view of a lateral photodiode illustrating the basic structure thereof.

In the mean time, FIG. 3 illustrates simulation results for the relationship between the reverse bias voltages and cutoff frequencies of the photodiode 10 of the present embodiment when the diameter of the light receiving section is assumed to be 50, 100 and 200 μm. Here again, the high speed response characteristics of the photodiode 10 of the present invention are confirmed.

FIGS. 4 to 7 illustrate simulation results for the extension of the depletion layer of (A), (B), (C), and (D) above respectively. As illustrated in these drawings, in the case of the present invention (D), the depletion layer is extended remarkably in the lateral direction and the extension thereof toward the substrate is restrained.

In each of FIGS. 4 to 7, the dotted line extending horizontal direction indicates the interface between the p-layer and n-layer, the dotted ellipse indicates the region where the depletion layer is extended, and each of a plurality of dotted lines within the ellipse indicates an equipotential line connecting the points of the same reverse bias potential and the extension of the depletion layer is indicated by these lines.

In the present embodiment, the p-type ($p^-$ type) active region 14 is formed by the injection of a p-type dopant. Alternatively, the p-type active region may also be formed by growing a Ge epitaxial layer on an n-type single-crystal Si layer. Note that the Ge epitaxial layer spontaneously becomes $p^-$ type in this case. The photodiode formed in the manner as described above has also excellent high speed response characteristics.

Second Embodiment

Figure 9:
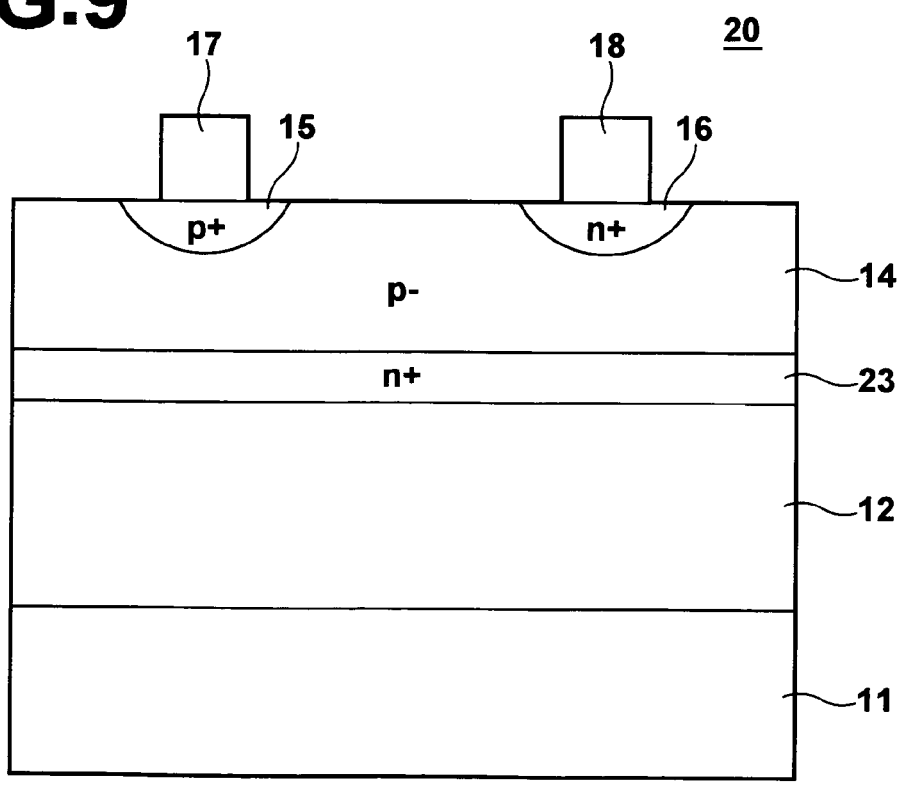
FIG. 9 is a schematic side view of the photodiode according to a second embodiment of the present invention.

Next, a second embodiment of the present invention will be described. FIG. 9 schematically illustrates the side shape of the lateral photodetector according to the second embodiment of the present invention. In the FIG. 9, components identical to those in FIG. 1 are given the same reference numerals and will not be elaborated upon further here unless otherwise specifically required (the same applies to hereinafter).

Here also, the photodetector in the present invention is, by way of example, a photodiode. The photodiode 20 differs from the photodiode 10 shown in FIG. 1 in that it uses a higher doping density substrate as the SOI substrate, thus an n-type ($n^+$-type) active region 23 having a higher doping density that the n-type active region 13 is formed. More specifically, the doping density is $1 \times 10^{19}$ $cm^{-3}$.

Provision of the n-type ($n^+$-type) active region 23 having such high doping density may provide the effect to extend the depletion layer upward, i.e, opposite to the substrate 11, and to enhance the electric field. In the present embodiment, the depletion layer is extended upward roughly 1.5 times that of the case where an n-type active layer having a doping density of $1 \times 10^{16}$ $cm^{-3}$ is formed. Further, the high doping density of the n-type ($n^+$-type) active region 23 makes the lifetime of carriers to be short. As a result, the amount of carriers, which are generated in the lower portion relatively remote from the electrodes and hamper the high speed response, becomes less, which is advantageous for realizing high speed response.

Third Embodiment

Figure 10:
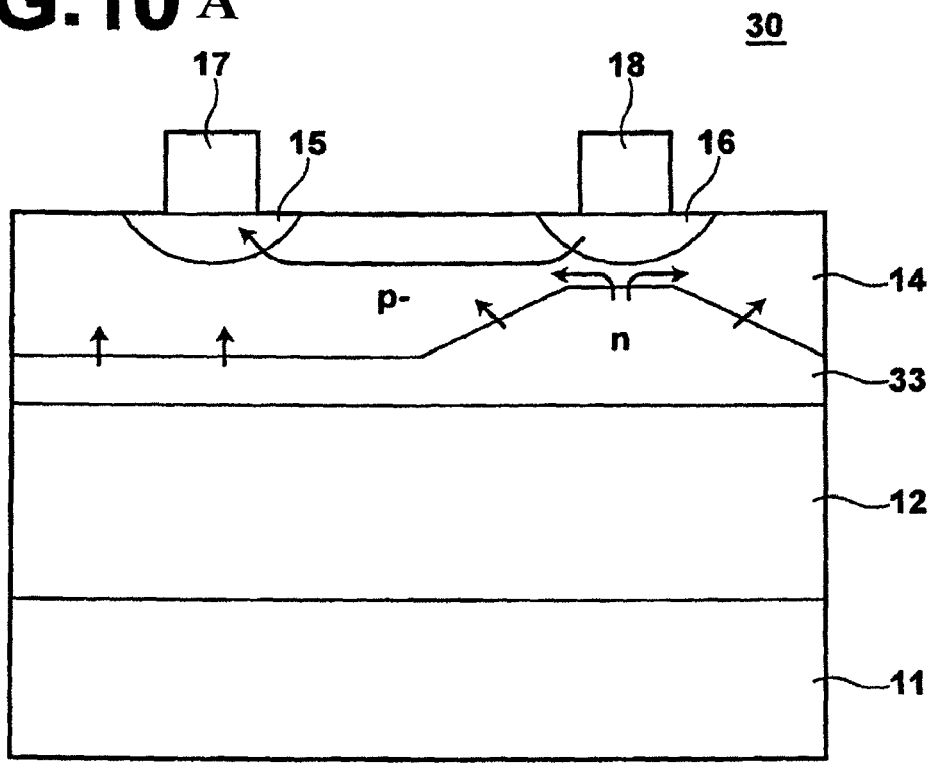
FIGS. 10A-B are schematic side views of the photodiode according to a third embodiment of the present invention.
Figure 10:
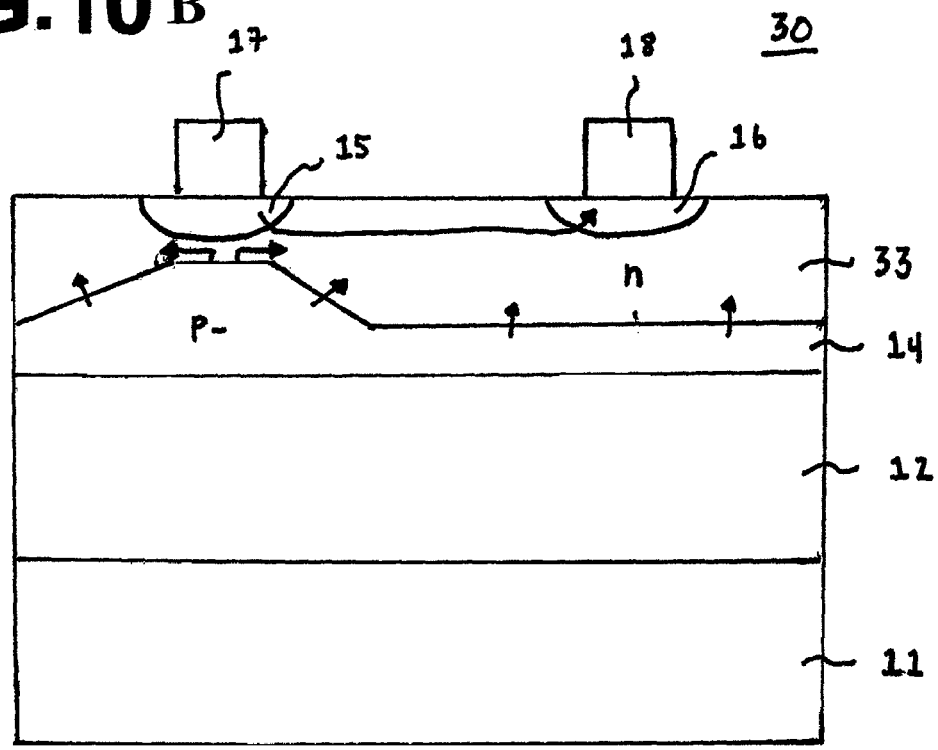

Next, a third embodiment of the present invention will be described. FIG. 10A illustrates the side shape of the lateral photodetector according to the third embodiment of the present invention. In the present embodiment also, the photodetector is, by way of example, a photodiode. The photodiode 30 differs from the photodiode 10 shown in FIG. 1 in that it includes an n-type active region 33 having varied thickness instead of the planar n-type active layer 13. That is, the n-type active region 33 is formed such that the thickness in the portion under the n.sup.+region 16 and anode 18 is greater than in the portion under the p.sup.+region 15 and cathode 17.

The photodiode 30 according to the present embodiment may basically provide the identical advantageous effects to those in the first and second embodiments. In addition, it may provide a greater electric field amplifying effect since it has a larger interface area between the n-type active region 33 and p-type active region 14, and the electric field of the built-in potential is generated directly in the lateral direction.

Figure 11:
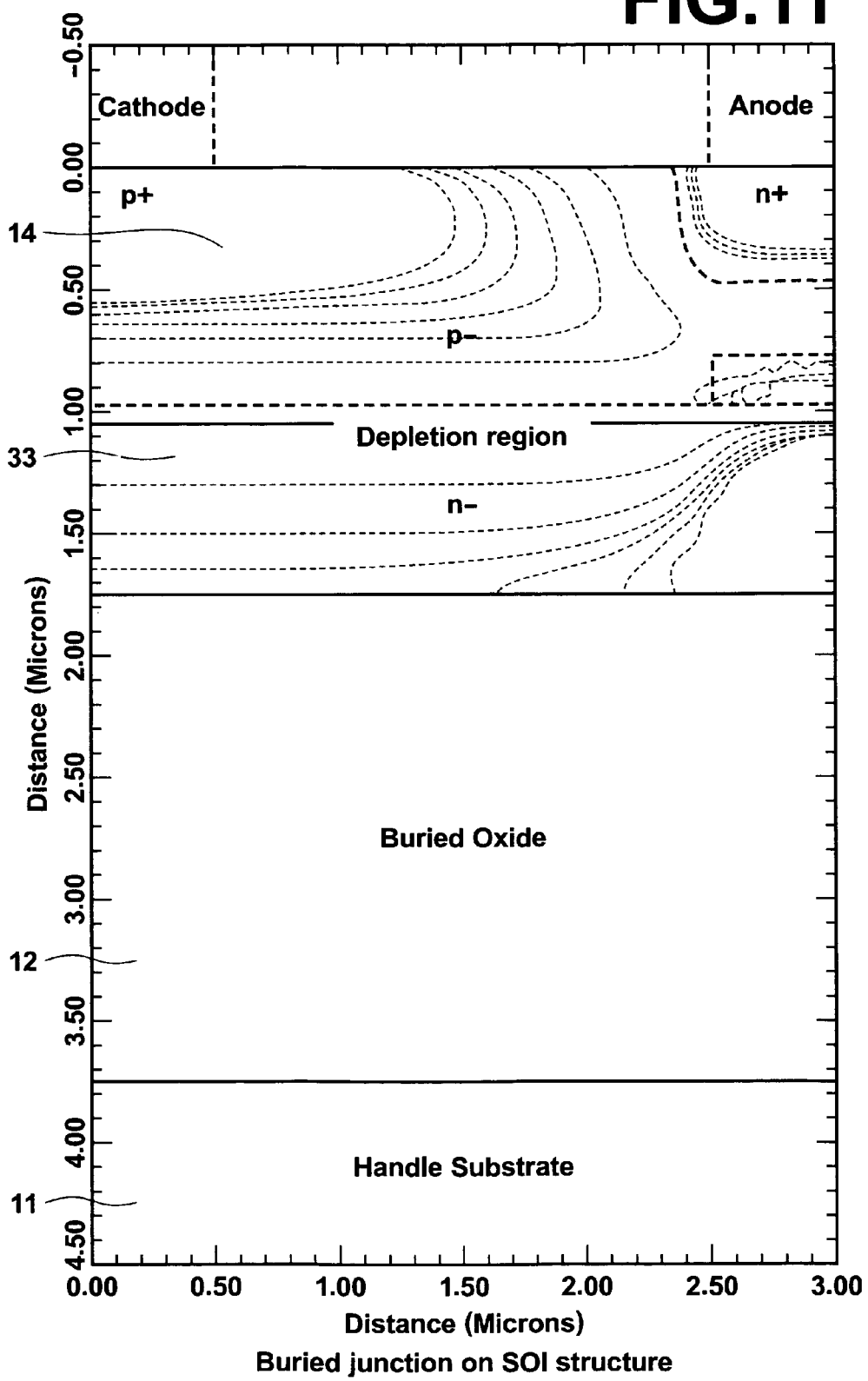
FIG. 11 illustrates simulation results for the extension of the depletion layer of the photodiode shown in FIG. 10A.

FIG. 11 illustrates simulation results for the extension of the depletion layer in the photodiode 30 in the third embodiment.

Figure 12A:
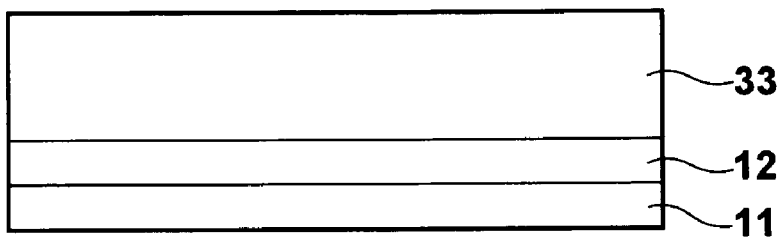
FIGS. 12A to 12D schematically illustrate a manufacturing method of the photodiode shown in FIG. 10A.
Figure 12B:
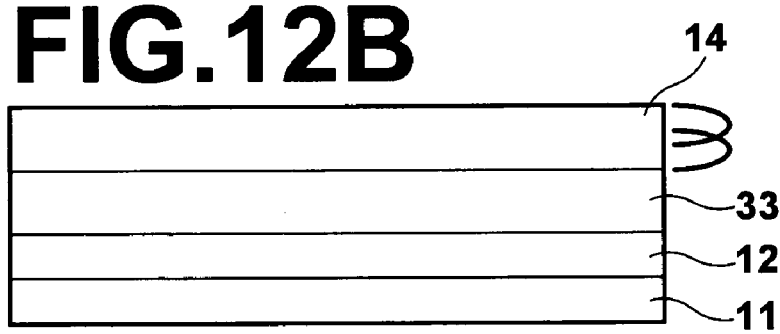

A method for manufacturing the photodiode of the present embodiment will now be described with reference to FIGS. 12A to 12D. As shown in FIG. 12A, an n-type SOI substrate including a handling substrate 11 with a $SiO_2$ insulation layer (barrier layer 12) and an n-type single crystal Si layer, to be the n-type active region 33, formed thereon in this order. Then, an alignment mark (not shown) to be described later is formed. Thereafter, as shown in FIG. 12B, a p-type dopant is injected into a region of the n-type single crystal Si layer from the surface to a predetermined depth thereof through ion injection to form the p-type active region 14 therein.

Figure 12C:
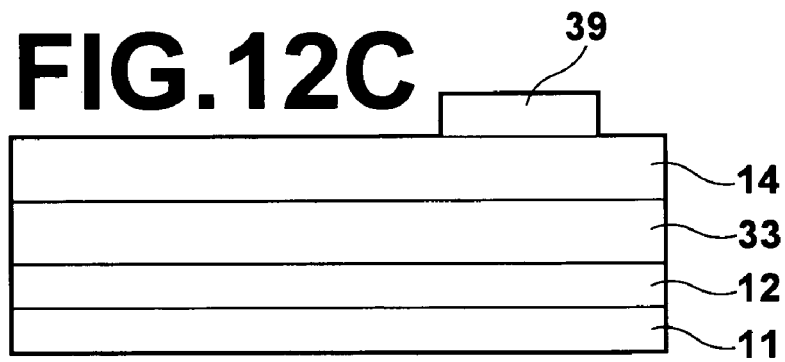

Then, as shown in FIG. 12C, a mask 39 for covering a region where the anode 18 FIG. 10A) is to be formed and the periphery thereof is formed on the p-type active region 14 by the commonly used photolithography and etching process. Here, the region for forming the mask 39 is determined with reference to the alignment mark.

Figure 12D:
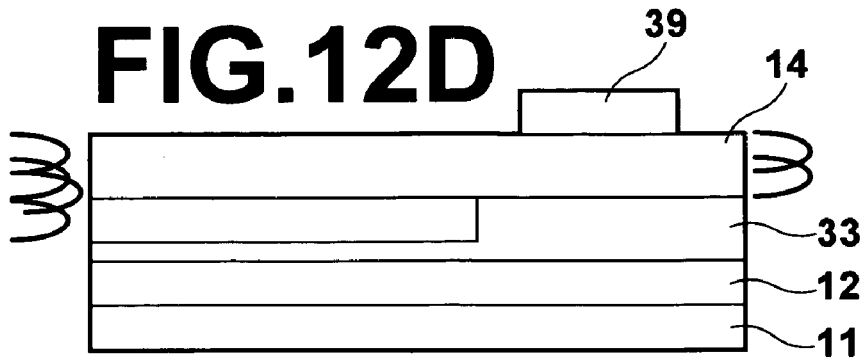

Then, as shown in FIG. 12D, injection of the p-type dopant is performed again over the mask 39. This causes the thickness of the p-type region in the portion which receives no effect from the mask 39 to be increased, i.e., the thickness of the n-type region in the portion to be decreased. Thereby, the layer structure illustrated in FIG. 10A is obtained. Thereafter, the manufacture of the photodiode 30 is completed after forming the p.sup.+region 15, n.sup.+region 16, cathode 17, and anode 18 through the commonly used process.

In the third embodiment, the n-type active layer 33 is formed in the near side to the barrier layer 12, and the p-type active layer 14 is formed in the remote side from the barrier layer 12, and a p-n junction is formed by the two layers. Alternatively, as illustrated in FIG. 10B, a configuration may be adopted in which the p-type active layer 14 is formed in the near side to the barrier layer, and the n-type active layer 33 is formed in the remote side from the barrier layer. In this case, the p-type active layer 14 is formed such that the thickness thereof in the portion under the p.sup.+region 15 and cathode 17 is greater than the thickness thereof in the portion under the n.sup.+region 16 and anode 18.

Fourth Embodiment

Next, a fourth embodiment of the present invention will be described. FIGS. 13A to 13C schematically illustrate a manufacturing process of the lateral photodetector according to the fourth embodiment of the present invention. The photodetector of the present embodiment is also, by way of example, a photodiode. The photodiode 40 of the present embodiment is manufactured by the following process. First, a substrate 41 is provided, and a barrier layer 42, for example $SiO_2$, is formed thereon as shown in FIG. 13A. Then, a separate substrate 43, for example, a p-type substrate is provided, and an n-type active region 44 is formed thereon by injecting an n-type dopant as shown in FIG. 13B.

Thereafter, the substrate 43 is bonded on the barrier layer 42 of the substrate 41, with the n-type active region 44 toward the barrier layer 42, as shown in FIG. 13C. Then, the substrate 43 is grinded to reduce the thickness thereof, and the manufacture of the photodiode 40 of the present embodiment is completed after forming the $p^+$ region 15, $n^+$ region 16, cathode 17, and anode 18 there through the commonly used process.

The photodiode 40 structured in the manner as described above also includes the barrier layer 42, and a p-n junction formed thereon, so that it has excellent high speed response characteristics basically identical to those in the embodiments described above.

Fifth Embodiment

Figure 14A:
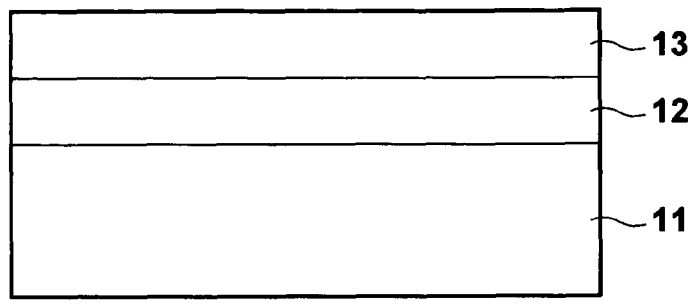
FIGS. 14A to 14C schematically illustrate a manufacturing method and the structure of the photodiode according to a fifth embodiment of the present invention.
Figure 14B:
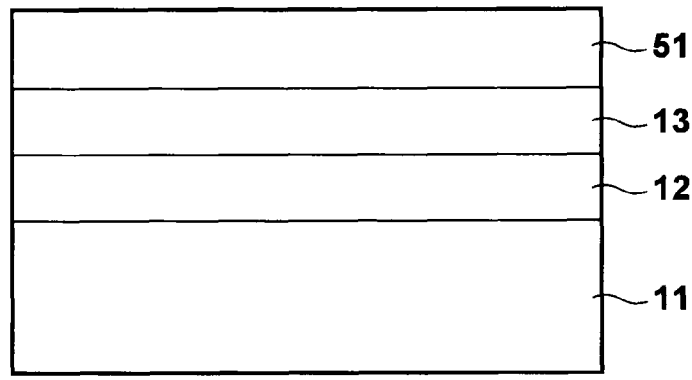
Figure 14C:
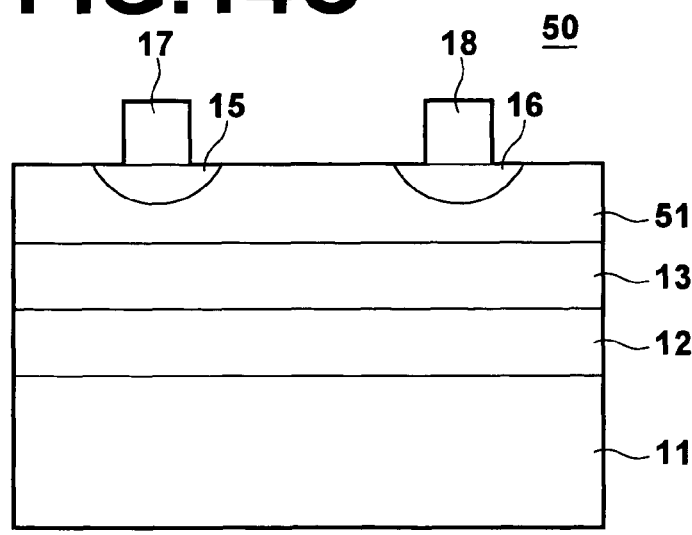

Next, a fifth embodiment of the present invention will be described. FIGS. 14A to 14C schematically illustrate a manufacturing process of the lateral photodetector according to the fifth embodiment of the present invention. The photodetector of the present embodiment is also, by way of example, a photodiode. The photodiode 50 of the present embodiment is manufactured by the following process. First, as shown in FIG. 14A, an n-type SOI substrate including a handling substrate 11 with a $SiO_2$ insulation layer (barrier layer 12) and an n-type single crystal Si layer, to be the n-type active region 13, formed thereon in this order as in the first embodiment.

Then, as shown in FIG. 14B, a p-type active region 51 is formed on the n-type active region 13 through the commonly used epitaxial growth process. Thereafter, as shown in FIG. 14C, the manufacture of the photodiode 50 of the present embodiment is completed after forming the $p^+$ region 15, $n^+$ region 16, cathode 17, and anode 18 there through the commonly used process.

The photodiode 50 structured in the manner as described above also includes the barrier layer 12 formed on the substrate 11, and a p-n junction formed thereon, so that it has excellent high speed response characteristics basically identical to those in the embodiments described above.

Sixth Embodiment

Figure 15:
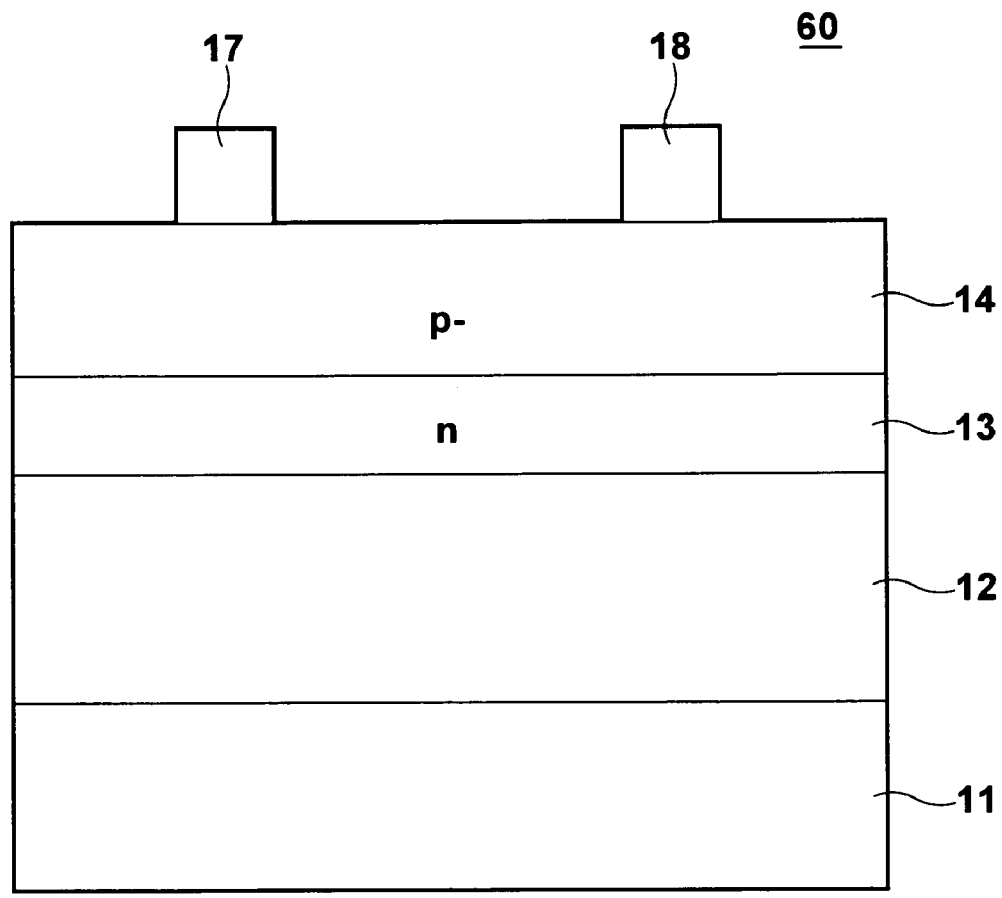
FIG. 15 is a schematic side view of the photodiode according to a sixth embodiment of the present invention.

Next, a sixth embodiment of the present invention will be described. FIG. 15 schematically illustrates the side shape of the lateral photodetector according to the sixth embodiment of the present invention. The photodetector of the present embodiment is a lateral MSM (Metal-Semiconductor-Metal) photodiode 60. The photodiode 60 basically differs from the photodiode 10 shown in FIG. 1 in that it excludes $p^+$ region 15 and $n^+$ region 16.

In the photodiode 60, a Schottky metal contact is formed between the cathode 17 and p-type active region 14, and between the anode 18 and p-type active region 14, and a photodetection function similar to a PIN photodiode is obtained by the potential barrier (Schottky barrier) formed across the contact. The photodiode 60 also includes the barrier layer 12 formed on the substrate 11, and a p-n junction formed thereon, so that it has excellent high speed response characteristics basically identical to those in the embodiments described above.

What is claimed is:
1. A lateral photodetector comprising:
a semiconductor substrate;

an active region with a p-type region and an n-type region arranged parallel to a surface of the semiconductor substrate, formed on the semiconductor substrate, light being detected by carrier movement between the p-type region and the n-type region, the active region being formed by a p-layer and an n-layer which are stacked in a thickness direction of the semiconductor substrate and constitute a p-n junction;

a barrier layer, for preventing movement of carriers from the semiconductor substrate toward the active region, being formed on the side of the active region toward the semiconductor substrate, one of the p-layer and the n-layer toward the side of the semiconductor substrate and two regions of the p-type region and the n-type region being separated by the other of the p-layer and the n-layer.

2. The photodetector according to claim 1, wherein the barrier layer includes SiO2.

3. The photodetector according to claim 1, wherein:
the photodetector comprises an SOI (Silicon on Insulator) substrate that includes a handling substrate on which an insulation layer and a silicon layer are formed in this order; and
the handling substrate of the SOI substrate constitutes the semiconductor substrate, the insulation layer on the handling substrate constitutes the barrier layer, and the silicon layer on the insulation layer constitutes the lower layer.

4. The photodetector according to claim 1, wherein a PIN photodetector structure is formed by the active region, p-type region, and n-type region.

5. A method for manufacturing the photodetector according to claim 1, comprising the steps of:
forming the barrier layer on a single substrate;
forming the p-n junction by injecting a dopant into another substrate;
bonding the another substrate on the single substrate; and
grinding the another substrate to reduce the thickness thereof and forming components that constitute a photodetector on the reduced substrate.

6. A method for manufacturing the photodetector according to claim 1, comprising the steps of:
forming the p-n junction by injecting a dopant into an SOI substrate; and
forming a photodetector on the substrate.

7. A method for manufacturing the photodetector according to claim 1, comprising the steps of:
growing an epitaxial layer on an SOI substrate so as to have an opposite conductivity type to that of the substrate; and
forming a photodetector on the epitaxial layer.

8. The manufacturing method according to claim 7, wherein a Ge epitaxial layer, which constitutes the p-type active layer, is grown on the silicon layer of the SOI substrate, which constitutes the n-type active layer.

9. A lateral photodetector comprising:
a semiconductor substrate;
a barrier layer formed on top of the substrate, the barrier layer covering the substrate; and
an active region, the active region comprising:
a lower layer formed on top of the barrier layer, the lower layer being one of an n-type active layer and a p-type active layer, the lower layer covering the barrier layer;
an upper layer formed on top of the lower layer, the upper layer being one of the n-type active layer and the p-type active layer that is not the lower layer, the upper layer covering the lower layer, the upper layer and the lower layer forming a p-n junction; and
a p-type region and an n-type region disposed near an open surface of the upper layer,
wherein the n-type active layer is the lower layer and a thickness of the n-type active layer under the n-type region is greater than the thickness of the n-type active layer under the p-type region.

10. A lateral photodetector comprising:
a semiconductor substrate;
a barrier layer formed on top of the substrate, the barrier layer covering the substrate; and
an active region, the active region comprising:
a lower layer formed on top of the barrier layer, the lower layer being one of an n-type active layer and a p-type active layer, the lower layer covering the barrier layer;
an upper layer formed on top of the lower layer, the upper layer being one of the n-type active layer and the p-type active layer that is not the lower layer, the upper layer covering the lower layer, the upper layer and the lower layer forming a p-n junction; and
a p-type region and an n-type region disposed near an open surface of the upper layer,
wherein the p-type active layer is the lower layer and a thickness of the p-type active layer under the p-type region is greater than the thickness of the p-type active layer under the n-type region.

11. A lateral MSM (Metal-Semiconductor-Metal) photodetector comprising:
a semiconductor substrate;
an active region formed on the semiconductor substrate;
a cathode and an anode arranged parallel to a surface of the semiconductor substrate, each forming a Schottky metal contact with the active region, light being detected by carrier movement between the cathode and the anode, the active region being formed by a p-layer and an n-layer which are stacked in a thickness direction of the semiconductor substrate and constitute a p-n junction;
a barrier layer, for preventing movement of carriers from the semiconductor substrate toward the active region, being formed on a side of the active region toward the substrate, and one of the p-layer and the n-layer toward the side of the substrate and electrodes of the cathode and the anode being separated by the other of the p-layer and the n-layer.

12. The photodetector according to claim 11, wherein the barrier layer includes SiO2.

13. The photodetector according to claim 11, wherein:
the photodetector comprises an SOI (Silicon on insulator) substrate that includes a handling substrate on which an insulation layer and a silicon layer are formed in this order; and
the handling substrate of the SOI substrate constitutes the semiconductor substrate, the insulation layer on the handling substrate constitutes the barrier layer, and the silicon layer on the insulation layer constitutes the lower layer.

14. A method for manufacturing the photodetector according to claim 11, comprising the steps of:
forming the barrier layer on a single substrate;
forming the p-n junction by injecting a dopant into another substrate;
bonding the another substrate on the single substrate; and
grinding the another substrate to reduce the thickness thereof and forming components that constitute a photodetector on the reduced substrate.

15. A method for manufacturing the photodetector according to claim 11, comprising the steps of:

forming the p-n junction by injecting a dopant into an SOI substrate; and forming a photodetector on the substrate.

16. A method for manufacturing the photodetector according to claim 11, comprising the steps of:

growing an epitaxial layer on an SOI substrate so as to have an opposite conductivity type to that of the substrate; and forming a photodetector on the epitaxial layer.

17. The manufacturing method according to claim 16, wherein a Ge epitaxial layer, which constitutes the p-type active layer, is grown on the silicon layer of the SOI substrate, which constitutes the n-type active layer.

18. A lateral MSM (Metal-Semiconductor-Metal) photodetector comprising:

a semiconductor substrate;

a barrier layer formed on top of the substrate;

an active region, the active region comprising:

a lower layer formed on top of the barrier layer, the lower layer being one of an n-type active layer and a p-type active layer, the lower layer covering the barrier layer; and an upper layer formed on top of the lower layer, the upper layer being one of the n-type active layer and the p-type active layer that is not the lower layer, the upper layer covering the lower layer, the upper layer and the lower layer forming a p-n junction; and a cathode and an anode that each form a Schottky metal contact with the active region, wherein the n-type active layer is the lower layer and a thickness of the n-type active layer under the anode is greater than the thickness of the n-type active layer under the cathode.

19. A lateral MSM (Metal-Semiconductor-Metal) photodetector comprising:

a semiconductor substrate;

a barrier layer formed on top of the substrate;

an active region, the active region comprising:

a lower layer formed on top of the barrier layer, the lower layer being one of an n-type active layer and a p-type active layer, the lower layer covering the barrier layer; and an upper layer formed on top of the lower layer, the upper layer being one of the n-type active layer and the p-type active layer that is not the lower layer, the upper layer covering the lower layer, the upper layer and the lower layer forming a p-n junction; and a cathode and an anode that each form a Schottky metal contact with the active region, wherein the p-type active layer is the lower layer and a thickness of the p-type active layer under the cathode is greater than the thickness of the p-type active layer under the anode.

* * * * *